(12) United States Patent
Mansour et al.

(10) Patent No.: US 10,886,949 B2
(45) Date of Patent: *Jan. 5, 2021

(54) FORWARD ERROR CONTROL CODING

(71) Applicant: TEXAS INSTRUMENTS INCORPORATED, Dallas, TX (US)

(72) Inventors: Mohamed Farouk Mansour, Richardson, TX (US); June Chul Roh, Allen, TX (US); Srinath Hosur, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/292,693

(22) Filed: Mar. 5, 2019

(65) Prior Publication Data

US 2019/0199378 A1 Jun. 27, 2019

Related U.S. Application Data

(63) Continuation of application No. 14/580,622, filed on Dec. 23, 2014, now Pat. No. 10,230,404.

(51) Int. Cl.
*H03M 13/00* (2006.01)
*H03M 13/29* (2006.01)
*H03M 13/27* (2006.01)
*H03M 13/09* (2006.01)
*H03M 13/15* (2006.01)

(52) U.S. Cl.
CPC ....... *H03M 13/2957* (2013.01); *H03M 13/27* (2013.01); *H03M 13/2966* (2013.01); *H03M 13/09* (2013.01); *H03M 13/1515* (2013.01); *H03M 13/618* (2013.01)

(58) Field of Classification Search
CPC ............. H03M 13/2957; H03M 13/27; H03M 13/2966; H03M 13/09; H03M 13/1515; H03M 13/618
See application file for complete search history.

(56) References Cited

U.S. PATENT DOCUMENTS

| | | | |
|---|---|---|---|
| 5,615,221 | A | 3/1997 | Karp et al. |
| 2001/0039637 | A1 | 11/2001 | Bengough |
| 2005/0101319 | A1 | 5/2005 | Murali et al. |
| 2005/0276344 | A1 | 12/2005 | Ling et al. |
| 2008/0098273 | A1 | 4/2008 | Blakenship et al. |
| 2008/0298435 | A1 | 12/2008 | Lakkis |
| 2009/0175210 | A1 | 7/2009 | Vijayan et al. |
| 2010/0039286 | A1 | 2/2010 | Robbins |

(Continued)

*Primary Examiner* — Samir W Rizk
(74) *Attorney, Agent, or Firm* — Gregory J. Albin; Charles A. Brill; Frank D. Cimino

(57) ABSTRACT

Disclosed embodiments include a device having a transmitter circuit that includes an input to receive data blocks that are part of a set of incoming data, a parity bit generator to append a number of parity bits to each of the received data blocks, a first encoder to apply a first type of encoding to create first coded blocks based on the received data blocks and the parity bits, an interleaver to interleave symbols in the first coded blocks to create additional blocks having a block size, wherein the number of parity bits appended to each of the received blocks is based on the block size, and a second encoder to apply a second type of encoding to create an output based on the additional blocks, wherein the second type of encoding is different from the first type of encoding.

18 Claims, 4 Drawing Sheets

(56) References Cited

U.S. PATENT DOCUMENTS

2010/0235706 A1    9/2010   Eberlein et al.
2012/0054585 A1    3/2012   Jiang et al.
2012/0079359 A1    3/2012   Buckley et al.

FORWARD ERROR CONTROL CODING

CROSS-REFERENCE TO RELATED APPLICATION(S)

This application is a continuation of U.S. patent application Ser. No. 14/580,622 filed on Dec. 23, 2014, which is incorporated herein by reference.

BACKGROUND

Wireless users require high-speed connections that support real time video, streaming music, and other multimedia applications. As a result, demands on wireless networks approach the broadband speeds and user experience provided by traditional DSL and cable modem wireline service. Wireless networks continue to evolve to next-generation packet architectures capable of supporting enhanced broadband connections with the introduction of 4G systems.

The higher speeds and capacity provided by 4G wireless networks put strain on backhaul networks and the carriers providing backhaul services as the transport requirements increase. Providers are shifting from traditional TDM transport in 2G and 3G networks to packet transport to support higher data rates, reduce network latency, and support flexible channel bandwidths in 4G networks. The backhaul networks require efficient Bit-Error-Rate (BER) performance to support 4G mobile networks.

SUMMARY OF THE INVENTION

Embodiments provide error control coding mechanisms for backhaul applications. Data is first encoded using Reed-Solomon (RS) coding. The output RS blocks are then turbo coded. The size of the output RS blocks is selected to match the input of the turbo encoder. The bits from the RS blocks may be interleaved to create the input turbo blocks. Cyclic Redundancy Check (CRC) parity bits may be added to the data prior to RS coding.

A transmitter provides forward error correction. The transmitter comprises a CRC parity bit generator that appends CRC bits to incoming data, a RS coder that creates RS blocks from the incoming data and CRC bits, an interleaver that interleaves symbols in the RS blocks to create turbo coder input blocks, and a turbo encoder that uses the turbo coder input blocks to create a signal to be sent to a receiver. The transmitter circuit may comprise a Digital Signal Processor (DSP) that provides hardware for the turbo encoder and CRC parity bit generator. Software instructions running on the DSP may provide the RS coder and the interleaver. The size of the RS blocks may be selected to match the input block size of the turbo coder so that an integer number of RS blocks are interleaved to create the turbo coder input blocks. The interleaver may sequential fill the turbo input blocks with symbols from successive RS blocks. The CRC parity bit generator and the turbo encoder may operate using parameters defined in the LTE standard.

A receiver decodes forward error corrected signals. The receiver comprises a turbo decoder that decodes received signals to create turbo output blocks, a de-interleaver that de-interleaves the turbo output blocks to create RS input blocks, a Reed-Solomon decoder that receives the RS input blocks and generates decoded output data, and a CRC parity bit check circuit that evaluates CRC bits in the decoded data. The receiver may further comprise a DSP that provides hardware for the turbo decoder and CRC parity bit check circuit. Software instructions running on the DSP may provide the RS decoder and the de-interleaver. The size of the RS blocks may be selected to match the output block size of the turbo decoder so that an integer number of RS blocks are de-interleaved from the turbo decoder output blocks.

BRIEF DESCRIPTION OF THE DRAWINGS

Figure 1:
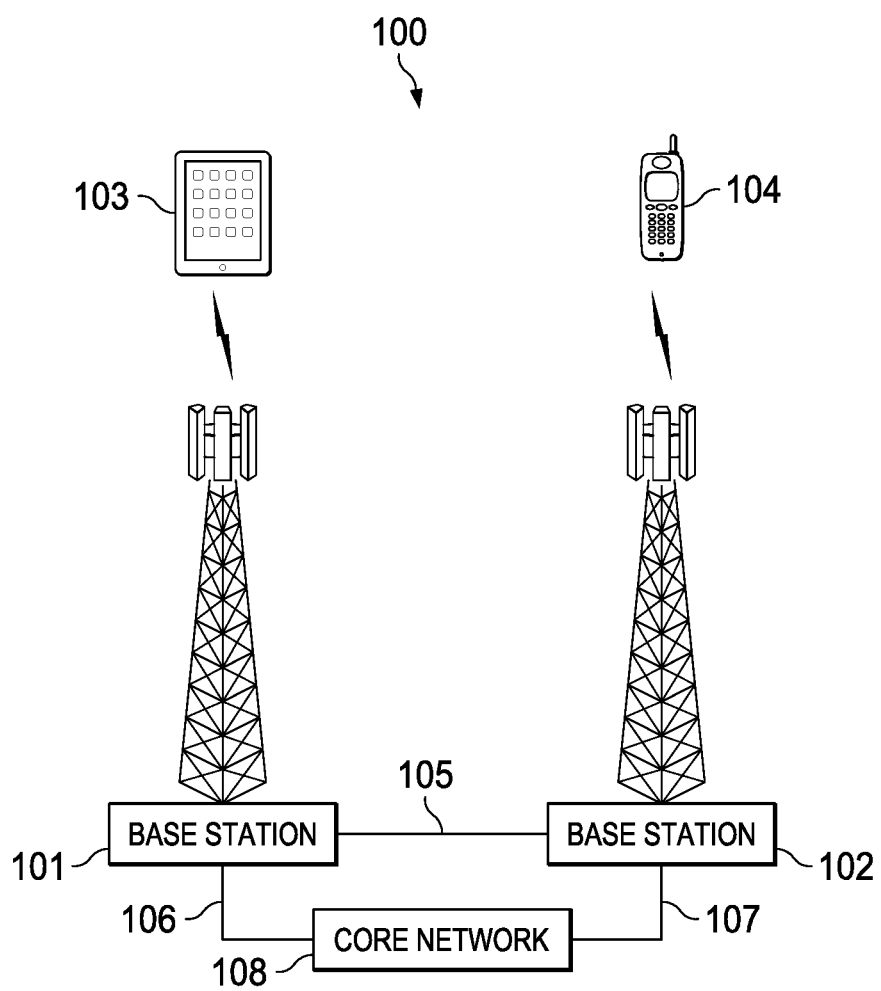
Figure 2:
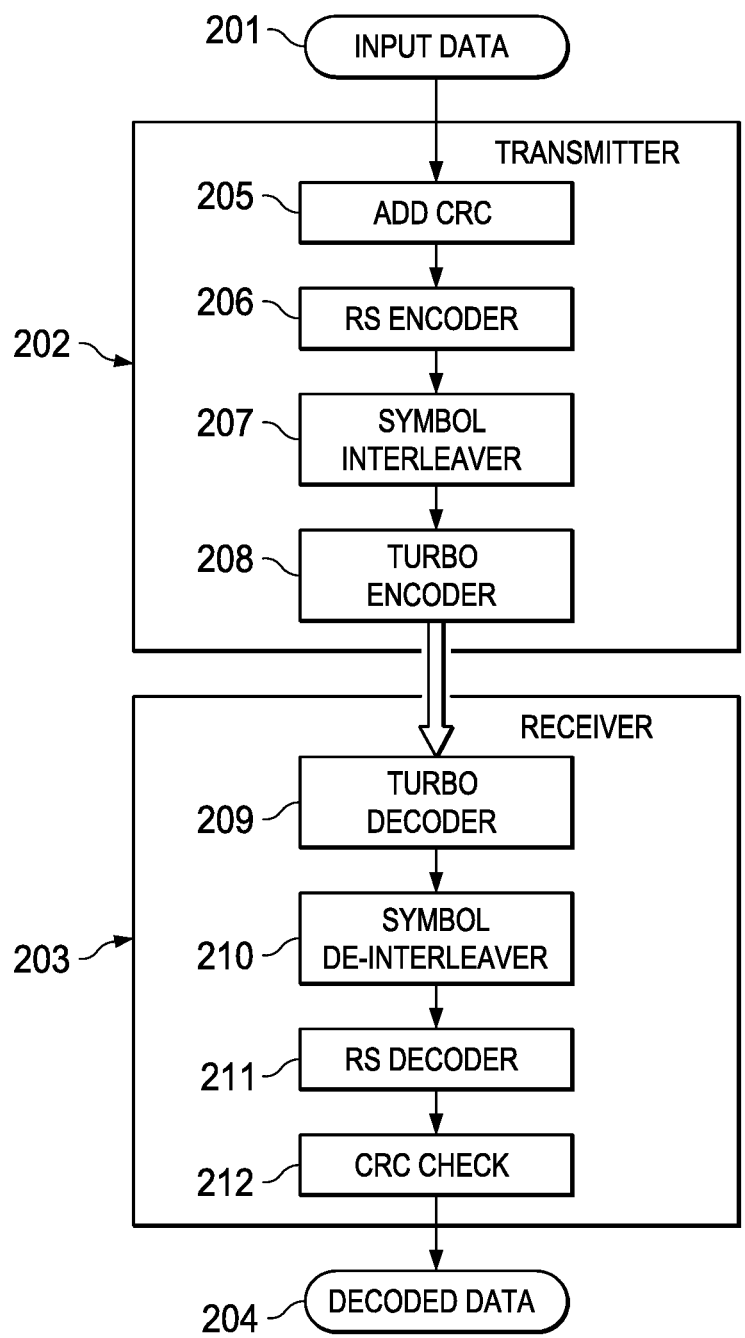
Figure 3:
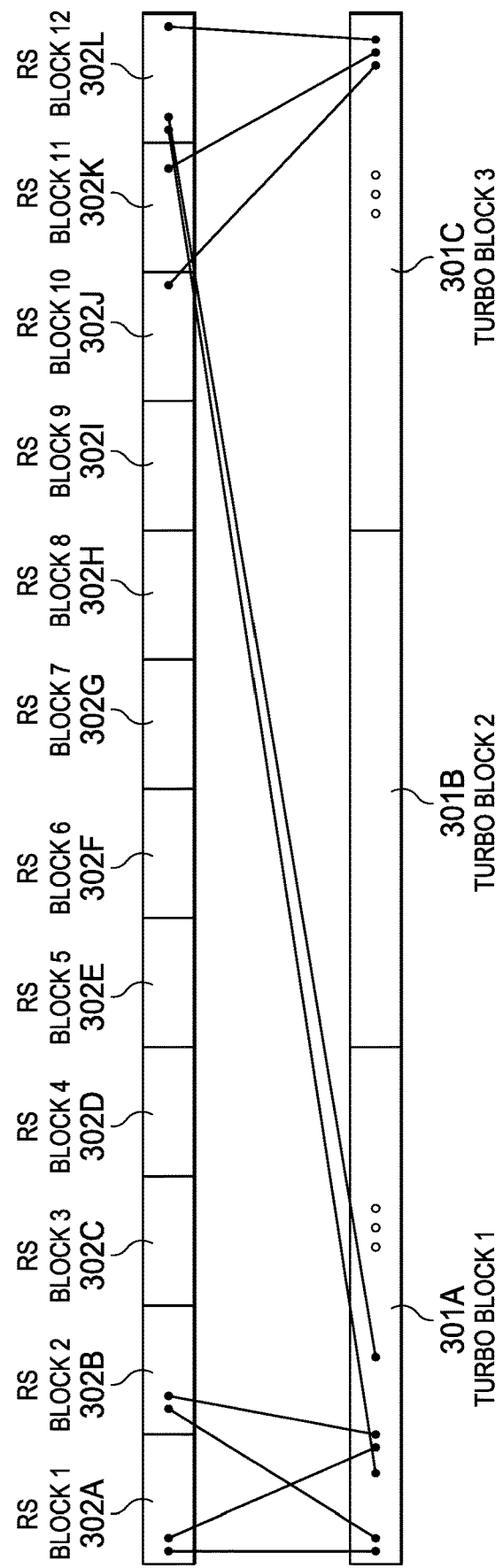
Figure 4:
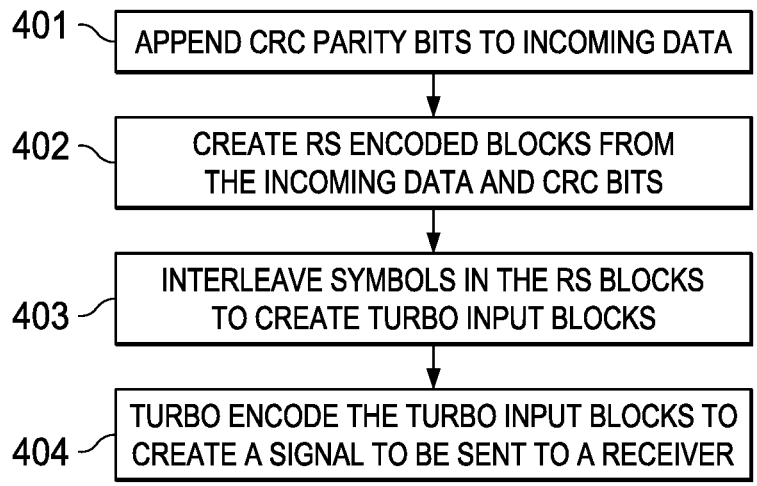
Figure 5:
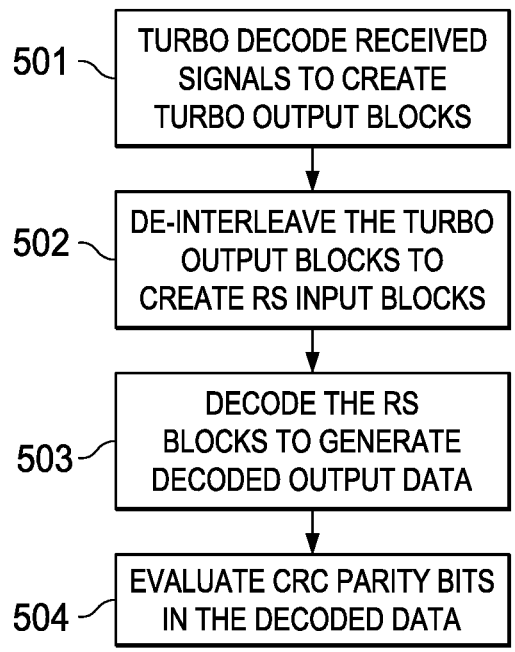

Having thus described the invention in general terms, reference will now be made to the accompanying drawings, wherein:

FIG. 1 is highly simplified block diagram of a system that may incorporate embodiments of the invention;

FIG. 2 is a block diagram of a system using a combination of RC coding and turbo coding according to one embodiment;

FIG. 3 illustrates interleaver operation in an embodiment with example block size 6144 and three turbo blocks;

FIG. 4 is a flowchart illustrating a method for encoding data to provide forward error correction according to one embodiment; and FIG. 5 is a method for decoding forward error corrected signals according to one embodiment.

DETAILED DESCRIPTION

The invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. One skilled in the art may be able to use the various embodiments of the invention.

FIG. 1 is a highly simplified block diagram of a system 100 which is part of a cellular communications network, such as a 3GPP Long Term Evolution (LTE) network. Base stations 101, 102 serve user equipment (UE) 103, 104 and other devices (not shown). Base stations 101, 102 may be, for example, LTE eNodeBs. Backhaul links 105-107 allow bases stations 101, 102 to communicate with each other or with core network 108.

Channel coding between base stations and UEs in an LTE network includes CRC and turbo coding schemes. LTE adopts turbo coding as the channel coding for the Physical Downlink Shared Channel (PDSCH), for example. Turbo coding provides sufficient BER for communications between base stations and UEs, but a more efficient BER is required for backhaul links 105-107.

Because turbo coding processors are already present in LTE base stations for use in UE communications, this available hardware can be incorporated into the design of error control coding for backhaul systems. LTE turbo codes may be used as the core part for error control coding. To cope with the error floor for turbo codes at high Signal-to-Noise Ratio (SNR), an outer code may be used to remove the residual errors of turbo codes. In embodiments disclosed herein, the RS block code is selected as the outer code for a Forward Error Correction (FEC) system. RS code offers excellent error correcting capability and has the maximum code rate for the number of corrected symbols.

FIG. 2 is a block diagram of a system using a combination of RS coding and turbo coding according to one embodiment. Input data 201 is received at transmitter 202, which applies FEC coding and transmits the data to receiver 203. Receiver 203 decodes the data to generate received decoded data 204. Transmitter 202 may be in base station 101, for example, and may use FEC for data sent over backhaul link 105 to base station 102 which includes receiver 203.

Transmitter 202 FEC adds CRC in block 205 and then RS encoding in block 206. To maximize concatenation gain, a symbol interleaver 207 is used between turbo encoder 208 and the RS encoder 206 so that symbol errors from the turbo code are dispersed between more than one RS code. This maximizes the error correcting capability of the concatenated code. In one embodiment, turbo encoder 208 may be a turbo hardware accelerator in an LTE base station. The RS encoder 206 and symbol interleaver 207 may be performed by software on the same DSP as the turbo hardware accelerator. In one embodiment, a single DSP core is dedicated to FEC processing to minimize data transfer among components in the transmitter. The output of turbo decoder 208 is transmitted to receiver 203.

Receiver 203 decodes the data received from transmitter 202. Received signals are processed in turbo decoder 209 and then symbol de-interleaver 210. The signal is then RS decoded in block 211 and CRC checked in block 212 to generate received decoded data 204. Similar to transmitter 202, turbo decoder 209 may be a turbo hardware accelerator DSP in an LTE base station, while the symbol de-interleaver 210 and RS decoder 211 may be performed by software on the same DSP as the turbo hardware accelerator. In one embodiment, a single DSP core is dedicated to error correction processing to minimize data transfer among components in the receiver.

The parameters used for the turbo+RS concatenated code may be selected to facilitate reuse of the hardware turbo modules in an LTE base station. LTE turbo code with code rate matching may be used to provide a near continuous range of code rates in the Modulation and Coding Scheme (MCS) table. In one embodiment, three block size of turbo codes {6144, 3072, 1024} may be used to provide a compromise between the performance and latency of FEC encoding/decoding. Additionally, the maximum number of turbo iterations is varied to improve this tradeoff. The exact output block size of the turbo encoder is varied to achieve maximum efficiency of the frame structure and minimize the number of unused filler bits.

The output block size of RS codes from RS encoder 206 should match the input block size of turbo codes in turbo encoder 208. The RS code is specified by three parameters (n, k, t), where n is the output block size (in symbols), k is the input block size in symbols, and t is the number of symbol errors that can be corrected. The three parameters are related where k=n−2t. To simplify software implementations of the RS encoder/decoder, RS over the field $GF(2^8)$ may be used so that the code symbols correspond to whole bytes. Two shortened RS codes may be used: (192,184,4) and (128,122,3). The first code (192,184,4) is used with turbo block sizes 6144 and 3072 bits. The second code (128,122,3) is used with turbo block size 1024 bits.

Table 1 lists RS codes for different turbo block sizes. For a turbo block size of 6144, there are four RS blocks of the constituent code (192,184,4) per a single turbo block. For a turbo block size of 3072, there are two RS blocks of the constituent code (192,184,4). For a turbo block of size 1024, there is a single RS block of the constituent code (128,122, 3).

TABLE 1

| Turbo Block Size (bits) | RS Code | Number of RS blocks per Turbo block |
|---|---|---|
| 6144 | (192, 184, 4) | 4 |
| 3072 | (192, 184, 4) | 2 |
| 1024 | (128, 122, 3) | 1 |

The input data block to the RS encoder is appended by CRC parity bits for error detection at the receiver. In one embodiment, a CRC accelerator on a bit rate coprocessor (BCP) for CRC encoder/decoder is used. The length of the CRC parity bits depends on the size of the turbo block size. The CRC polynomials for LTE may be used for generating the parity bits. Table 2 lists the length of the CRC parity check bits for the turbo block sizes used in the example of Table 1.

TABLE 2

| Turbo Block Size (bits) | Length of CRC Parity Bits |
|---|---|
| 6144 | 24 |
| 3072 | 16 |
| 1024 | 8 |

The possible information block sizes for different turbo block sizes are summarized in Table 3. The information data block size is the turbo block size minus parity bits of the RS minus the CRC bits.

TABLE 3

| Turbo Block Size (bits) | Length of Information Block Size (bits) |
|---|---|
| 6144 | 5864 |
| 3072 | 2928 |
| 1024 | 968 |

To increase the FEC efficiency, multiple turbo blocks may be interleaved together before RS encoding. This distributes the turbo decoder error among more turbo blocks for more error protection. Up to three turbo blocks may be interleaved together, and the corresponding number of RS block is multiplied accordingly.

As illustrated in FIG. 2, the FEC encoder is comprised of four components: CRC generator, RS encoder, interleaver, and Turbo encoder.

The length of the CRC parity bits depends on the turbo block size as illustrated in Table 2. The generator polynomials from the LTE standard may be used for the different size CRC generation:

$$g_{crc24}=D^{24}+D^{23}+D^{18}+D^{17}+D^{14}+D^{11}+D^{10}+D^{7}+D^{6}+D^{5}+D^{4}+D^{3}+D+1$$

$$g_{crc16}=D^{16}+D^{12}+D^{5}+1$$

$$g_{crc8}=D^{8}+D^{7}+D^{4}+D^{3}+D+1$$

The encoding and decoding is done similar to LTE to enable the reuse of the hardware accelerator.

After adding the CRC parity bits, the input block size is segmented to RS blocks. The number of RS blocks depends on the turbo block size and the number of turbo blocks. For example, with three turbo blocks of size 6144, then there are a total of 12 RS (192,184,4) blocks; or with one turbo block of size 1024, then there is one RS (128,122,3) block.

The interleaver maps the output RS blocks to the input of turbo blocks. The objective of the interleaver is to spread any possible error from the turbo decoder among as many RS blocks as possible to maximize the correcting probability. The RS output is in symbols (i.e., 8 bits), while the unit in the turbo block is a bit.

FIG. 3 illustrates the interleaver operation in an embodiment with block size 6144 and three turbo blocks 301A-C. In this example, there are a total of 12 RS blocks (192,184,4) 302A-L. The turbo blocks 301A-C are filled sequentially by symbols from successive RS blocks 302A-L. For example, the first 8 bits in the first turbo block 301A are from the first symbol (i.e., 8 bits) of the first RS block 302A, the second 8 bits of the first turbo block 301A are the first output symbol from the second RS block 302B, and the $12^{th}$ set of 8 bits in the first turbo block 301A are the first output symbol in the $12^{th}$ RS block 302L, and so on as shown in FIG. 3. The whole eight bits of each RS symbol are sequentially placed in the corresponding locations in the turbo block.

This interleaving may be described algebraically as follows. Assume M turbo blocks of length L bits and N RS blocks per turbo block each RS block has output size of K=L/8N symbols. The output symbols of all RS blocks may be arranged in a matrix of size MN×K. Each row contains the output symbols of the corresponding RS block. The matrix may be converted to a column vector by raster scanning column wise (i.e., first column then second column and so on). The vector of symbols is then converted to a vector of bits by expanding each symbol to 8 bits. This generates long vector of length LM bits. The vector is then converted to a matrix of size L×M with each column corresponding to an input turbo block of size L bits.

The turbo encoding may be performed using a bit rate coprocessor hardware accelerator. An LTE rematching module may be used to generate the exact output block size as described in the MCS table. The RS encoder uses standard shortened RS blocks as specified in Table 1.

FIG. 4 is a flowchart illustrating a method for encoding data to provide forward error correction according to one embodiment. In step 401, CRC parity bits are appended to incoming data. In step 402, RS encoded blocks are created from the incoming data and CRC bits. In step 403, symbols in the RS blocks are interleaved to create turbo input blocks. The interleaving may be sequential fill the turbo input blocks with symbols from successive RS blocks. In step 404, the turbo input blocks are turbo encoded to create a signal to be sent to a receiver.

The CRC parity bits and turbo encoding of the input blocks may be performed using DSP hardware. Software instructions on the DSP may be used to create the RS encoded blocks and interleave the RS blocks. The size of the RS blocks may be selected to match the input block size of the turbo coder so that an integer number of RS blocks are interleaved to create the turbo coder input blocks. The CRC parity bits and the turbo encoder operation may be compatible with the LTE standard.

FIG. 5 is a method for decoding forward error corrected signals according to one embodiment. In step 501, received signals are turbo decoded to create turbo output blocks. In step 502, the turbo output blocks are de-interleaved to create RS input blocks. In step 503, the RS input blocks are RS decoded to generate decoded output data. In step 504, CRC parity bits in the decoded data are evaluated.

The turbo decoding and evaluating CRC parity bits may be performed by DSP hardware. Software instructions executing on the DSP may decode the RS input blocks and de-interleave the turbo output blocks. The size of the RS blocks is selected to match the output block size of the turbo decoder so that an integer number of RS blocks are de-interleaved from the turbo decoder output blocks.

Although the detailed example described above is used in connection with an LTE system, it will be understood that embodiments may be used with systems complying with any wireless protocol or standard.

Many modifications and other embodiments of the invention will come to mind to one skilled in the art to which this invention pertains having the benefit of the teachings presented in the foregoing descriptions, and the associated drawings. Therefore, it is to be understood that the invention is not to be limited to the specific embodiments disclosed. Although specific terms are employed herein, they are used in a generic and descriptive sense only and not for purposes of limitation.

What is claimed is:

1. An electronic device comprising:
a transmitter circuit having:
an input to receive data blocks, the data blocks being at least part of a set of incoming data;
a parity bit generator to append a number of parity bits to each of the received data blocks;
a first encoder to apply a first type of encoding to create first coded blocks based on the received data blocks and the parity bits;
an interleaver to interleave symbols in the first coded blocks to create additional blocks having a block size, wherein the number of parity bits appended to each of the received data blocks is based on the block size; and
a second encoder to apply a second type of encoding to create an output based on the additional blocks, wherein the second type of encoding is different from the first type of encoding.

2. The electronic device of claim 1, wherein the first type of encoding is Reed-Solomon (RS) encoding and the first coded blocks are RS blocks.

3. The electronic device of claim 1, wherein the second type of encoding is turbo encoding.

4. The electronic device of claim 1, wherein:
the first type of encoding is Reed-Solomon (RS) encoding; and
the second type of encoding is turbo encoding.

5. The electronic device of claim 1, wherein the first coded blocks have a size that matches an input block size of the second encoder so that an integer number of the first coded blocks are interleaved by the interleaver to create the additional blocks.

6. The electronic device of claim 1, wherein the parity bits are cyclic redundancy check (CRC) bits.

7. The electronic device of claim 1, wherein the interleaver is configured to sequentially fill the additional blocks with symbols from successive first coded blocks.

8. The electronic device of claim 1, wherein the electronic device is a base station and the transmitter is a transmitter of the base station.

9. The electronic device of claim 8, wherein the base station is a Long Term Evolution (LTE) base station.

10. The electronic device of claim 1, wherein the transmitter circuit is operable to transmit the output created by the second encoder.

11. An electronic device comprising:
a receiver circuit having:
an input to receive a signal;
a first decoder to apply a first type of decoding to the signal to create first decoded output blocks;

a de-interleaver to de-interleave the first decoded output blocks to produce additional blocks;

a second decoder to apply a second type of decoding to the additional blocks to produce second decoded output blocks, wherein each second decoded output block includes a number of parity bits, and wherein the second type of decoding is different from the first type of decoding; and a parity bit generator checking circuit to evaluate the parity bits in each of the second decoded output blocks, wherein the number of parity bits is based on a block size of the first decoded output blocks.

12. The electronic device of claim 11, wherein the first type of decoding is turbo decoding.

13. The electronic device of claim 11, wherein the second type of decoding is Reed-Solomon (RS) decoding.

14. The electronic device of claim 11, wherein:

the first type of decoding is turbo decoding;

the second type of decoding is Reed-Solomon (RS) decoding; and the additional blocks produced by the de-interleaver are RS input blocks.

15. The electronic device of claim 11, wherein the additional blocks have a size that matches an output block size of the first decoder so that an integer number of the additional blocks are de-interleaved from the first decoded output blocks.

16. The electronic device of claim 11, wherein the parity bits are cyclic redundancy check (CRC) bits.

17. The electronic device of claim 11, wherein the electronic device is a base station and the receiver is a receiver of the base station.

18. The electronic device of claim 17, wherein the base station is a Long Term Evolution (LTE) base station.

* * * * *